United States Patent
Tien et al.

(10) Patent No.: US 9,462,679 B2
(45) Date of Patent: Oct. 4, 2016

(54) ATTENUATION REDUCTION GROUNDING PATTERN STRUCTURE FOR CONNECTION PADS OF FLEXIBLE CIRCUIT BOARD

(71) Applicant: ADVANCED FLEXBLE CIRCUITS CO., LTD., Taoyuan County (TW)

(72) Inventors: Ching-Cheng Tien, Hsinchu (TW); Gwun-Jin Lin, Taoyuan County (TW); Chih-Heng Chuo, Taoyuan County (TW); Kuo-Fu Su, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 309 days.

(21) Appl. No.: 14/256,029

(22) Filed: Apr. 18, 2014

(65) Prior Publication Data
US 2014/0318833 A1    Oct. 30, 2014

(30) Foreign Application Priority Data

Apr. 26, 2013 (TW) .............................. 102114996 A (51) Int. Cl.
*H05K 1/02* (2006.01)
*H05K 3/34* (2006.01)

(52) U.S. Cl.
CPC ............ *H05K 1/0253* (2013.01); *H05K 1/0224* (2013.01); *H05K 1/0227* (2013.01); *H05K 1/0245* (2013.01); *H05K 3/3421* (2013.01); *H05K 2201/0949* (2013.01); *H05K 2201/09727* (2013.01); *H05K 2201/10189* (2013.01); *H05K 2201/10689* (2013.01)

(58) Field of Classification Search
None
See application file for complete search history.

(56) References Cited

U.S. PATENT DOCUMENTS

| | | | |
|---|---|---|---|
| 7,408,512 B1* | 8/2008 | Rodenbeck | H01Q 1/2208 343/700 MS |
| 2002/0039267 A1* | 4/2002 | Kudo | H01P 3/081 361/33 |
| 2004/0188136 A1* | 9/2004 | Sunohara | H01L 21/6835 174/255 |
| 2004/0246626 A1* | 12/2004 | Wakaki | G11B 5/486 360/245.8 |
| 2007/0102830 A1* | 5/2007 | Muto | H05K 1/0219 257/784 |
| 2007/0158797 A1* | 7/2007 | Lee | H01L 23/3107 257/676 |
| 2009/0308638 A1* | 12/2009 | Cho | H05K 3/361 174/254 |
| 2011/0014818 A1* | 1/2011 | Carter | H01R 9/03 439/660 |
| 2015/0270593 A1* | 9/2015 | Chuo | H01P 1/227 333/81 A |
| 2016/0088724 A1* | 3/2016 | Chuo | H01P 3/02 333/238 |

* cited by examiner

*Primary Examiner* — Jeremy C Norris
*Assistant Examiner* — Muhammed Azam
(74) *Attorney, Agent, or Firm* — Rosenberg, Klein & Lee (57) ABSTRACT

An attenuation reduction grounding pattern structure for connection pads of a flexible circuit board includes a plurality of high frequency connection pads formed on a component surface of a substrate and a plurality of differential mode signal lines arranged on the substrate and connected to the high frequency connection pads. The substrate has a grounding surface forming a grounding layer. The grounding layer includes an attenuation reduction grounding pattern structure formed at a location corresponding to the transition zone and including a hollowed area and a protruded portion. The protruded portion extends a predetermined length in a direction from the grounding layer toward the high frequency connection pads and along the adjacent high frequency connection pads to reach the transition zone. The protruded portion and the high frequency connection pads form a polarization-direction-varying electric field in the transition zone.

5 Claims, 7 Drawing Sheets

ATTENUATION REDUCTION GROUNDING PATTERN STRUCTURE FOR CONNECTION PADS OF FLEXIBLE CIRCUIT BOARD

BACKGROUND OF THE INVENTION

1. Field of the Invention

The present invention relates to a structural design for improving the quality of high frequency signal transmission of a circuit board, and in particular to a structure of a flexible circuit board that includes an attenuation reduction grounding pattern structure and the attenuation reduction grounding pattern structure is provided corresponding to connection pads carrying high frequency signals of the flexible circuit board.

2. The Related Arts

Due to the amount of data transmitted through signal lines being increasingly large, electronic devices of the present day requires an increased number of signal transmission lines and also needs the signals to be transmitted in increasingly higher frequencies. Thus, at present, differential mode signal transmission technology has been widely used to reduce electromagnetic interference (EMI). For example, such a technology has been largely used for signals of USB, LVDS (Lowe Voltage Differential Signaling), and EDP (Embedded Display Port) to reduce EMI.

In the differential mode signal transmission technology, two differential mode signal lines are coupled to form a signal line pair for transmission of signals that have the same amplitude but opposite phases. An external interference signal will induce common-mode noises having identical amplitude and phase in the two signal lines and will be expelled by a differential input pair of an integrated device so as to achieve improved suppression of EMI in the circuit.

Although the differential mode signal transmission can greatly improve potential problems that might occur in the transmission of signals, in a practical application, a poor design might result in problems associated with signal reflection, scattering of electromagnetic signals, loss of signal transmission and receipt, and distortion of waveforms of signals. These problems get severe particularly for flexible circuit boards having reduced substrate thickness. Factors that cause such problems include: poor matching of characteristic impedance of the differential mode signal lines in extension directions, poor control of excessive stray capacitance effect between high frequency connection pads and a grounding layer, non-matching of characteristic impedance of the differential mode signal lines and the high frequency connection pad.

Further, for example, when a flexible circuit board is plugged into an insertion slot of a female socket connector, the differential mode signal lines and the high frequency connection pads will induce parasitic capacitance and inductance with respect to conductive terminals inside the female socket connector, which cause reflection and loss of the high frequency components of digital signals and thus affect the quality of high speed digital signal transmission.

Further, for example, in an application where a connector is mounted on a flexible circuit board, the differential mode signal lines and the high frequency connection pads will induce parasitic capacitance and inductance with respect to signal connection pins of the connector, which also affect the quality of high frequency signal transmission.

In the known techniques, suppressing interference of electromagnetic wave radiation in a length extension direction of the differential mode signal lines and overcoming the problems of impedance matching have been researched and various techniques have been proposed. However, for the connection site, as well as neighboring areas, between the differential mode signal lines and the high frequency connection pads provided on a flexible circuit board, due to the line width of the differential mode signal line (the line width being extremely small) and the dimension specifications of the signal connection pins and components of the connector (which are of relatively large sizes as compared to the line width of the signal lines), up to date, there is still no satisfactory solution proposed by the business to ensure the quality of high frequency signal transmission.

Further, in applications where a flexible circuit board is plugged into an insertion slot of a female socket connector and a connector is provided on a flexible circuit board, there is still no satisfactory solution for handling the issues regarding the quality of high frequency signal transmission between the differential mode signal lines and the high frequency connection pads and the conductive terminals of the female socket connector and the signal connection pins of the connector.

SUMMARY OF THE INVENTION

Thus, an object of the present invention is to provide an attenuation reduction grounding pattern structure for connection pads of a flexible circuit board. The attenuation reduction grounding pattern structure is formed at a site corresponding to a transition region defined between differential mode signal lines and high frequency connection pads of the flexible circuit board. The attenuation reduction grounding pattern structure provides excellent impedance with the high frequency connection pads so as to reduce reflection and loss of high frequency components occurring in the transmission of a signal thereby improving the signal transmission quality of the differential mode signal lines of the flexible circuit board.

Another object of the present invention is to provide an attenuation reduction grounding pattern structure for connection pads of a flexible circuit board that has a gradually varying electric field polarization direction, wherein in a transition region between the high frequency connection pads and the differential mode signal lines, a protruded portion of the attenuation reduction grounding pattern structure helps gradually convert a vertical electric field of the differential mode signal lines into a horizontal electric field for the high frequency connection pads.

The technical solution that the present invention adopts to overcome the problems of the prior art is that a plurality of high frequency connection pads are provided on a component surface of a substrate and a plurality of differential mode signal lines are laid on the substrate and is connected through a transition zone to the high frequency connection pads. The substrate has a grounding surface that comprises a grounding layer. The grounding layer comprises a hollowed area formed at a location corresponding to the high frequency connection pads. The transition zone has a grounding line that is a protruded portion extending a predetermined length along a center line of the transition zone from the grounding layer of the differential mode signal lines toward the high frequency connection pads to reach the hollowed area. The protruded portion and the differential mode signal lines of the transition zone form a polarization-direction-varying electrical field.

In a preferred embodiment of the present invention, the protruded portion comprises a gradually reduced width so that the protruded portion has a large width connected to the grounding layer and an increasingly reduced width in the extension direction toward the high frequency connection pads.

In another embodiment of the present invention, the high frequency connection pads each further form a conductive via arrangement extension section and at least one conductive via is formed in the conductive via arrangement extension section. The high frequency connection pads are connected through the conductive vias to differential mode signal lines formed on an opposite surface of the substrate to achieve a purpose of double-sided board wire jumping or multi-layered board signal line jumping.

With the technical solution adopted by the present invention, the polarization-direction-varying electrical field induced by the arrangement of the attenuation reduction grounding pattern structure may help reduce reflection loss occurring in the transmission of a high frequency signal, achieve an excellent effect of impedance match, reduce the probability of error in the transmission of a high frequency differential mode signal, and ensure the quality of high frequency signal transmission.

In an application where a flexible circuit board is combined with a connector, when the differential mode signal lines transmit a high frequency differential mode signal and feed the high frequency differential mode signal to signal connection pins, the grounding pattern structure of the present invention also helps, for the transmission of the high frequency signal by the differential mode signal lines from the extension section to the high frequency connection pads, achieve an effect of impedance matching between the two sections, thereby reducing the probability of error in the transmission of the high frequency differential mode signal and ensuring the quality of high frequency signal transmission.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1:
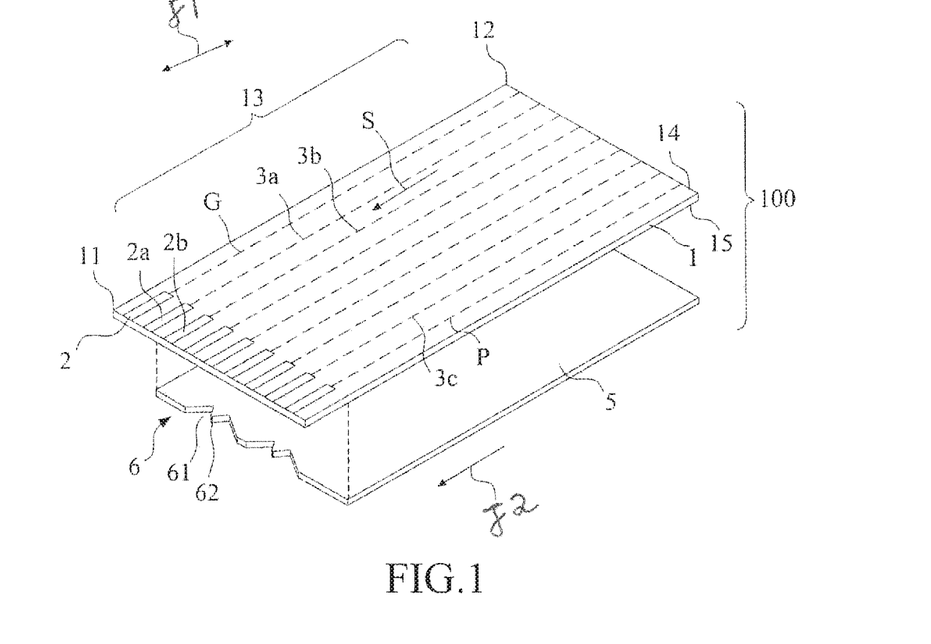
FIG. 1 is an exploded view showing a first embodiment according to the present invention.
Figure 2:
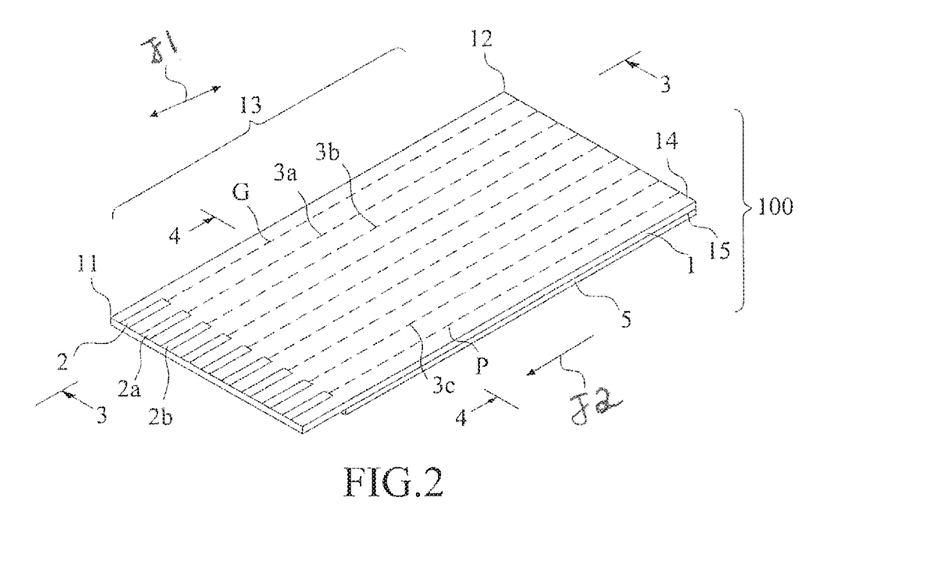
FIG. 2 is a perspective view showing the first embodiment of the present invention.

Referring to FIGS. 1 and 2, of which FIG. 1 is an exploded view showing a first embodiment of the present invention and FIG. 2 is a perspective view showing the first embodiment of the present invention, flexible circuit board 100 according to the instant embodiment comprises a substrate 1. The substrate 1 comprises a first end 11, a second end 12, and an extension section 13 arranged between the first end 11 and the second end 12 and extending in an extension direction J1.

A plurality of connection pads 2 are arranged in a connection pad laying zone A1 defined on a component surface 14 of the substrate 1 and adjacent to the first end 11 of the substrate 1 to be adjacent to insulated from each other. The connection pads 2 comprise at least one pair of high frequency connection pads 2a, 2b for carrying high frequency signals. It is understood that the connection pads 2 may include well-known connection pads for soldering purpose and contact pads for electrically contacting purpose.

The extension section 13 comprises at least one pair of differential mode signal lines 3a, 3b laid thereon for carrying at least one high frequency differential mode signal S. The differential mode signal lines 3a, 3b are respectively connected to the high frequency connection pads 2a, 2b. The extension section 13 also comprises a common mode signal conductor 3c, a power line P, and a grounding line G, all these signal lines being connected to designated ones of the connection pads 2.

Figure 3:
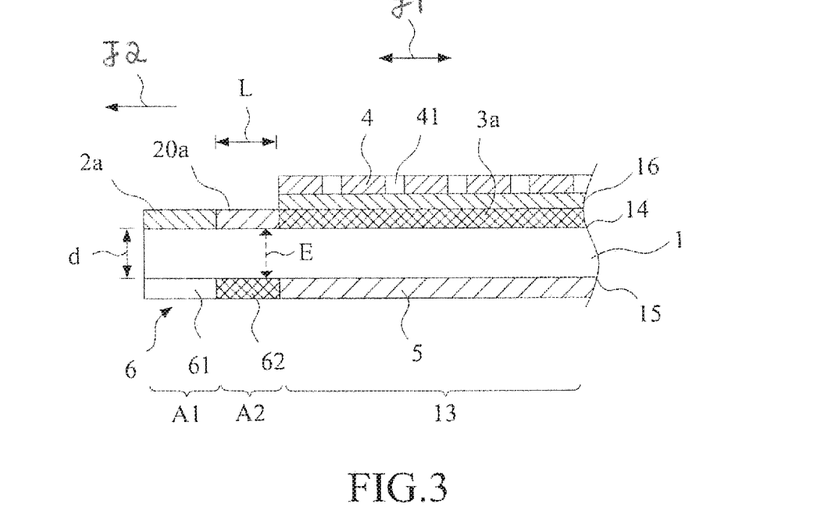
FIG. 3 is across-sectional view taken along line 3-3 of FIG. 2.
Figure 4:
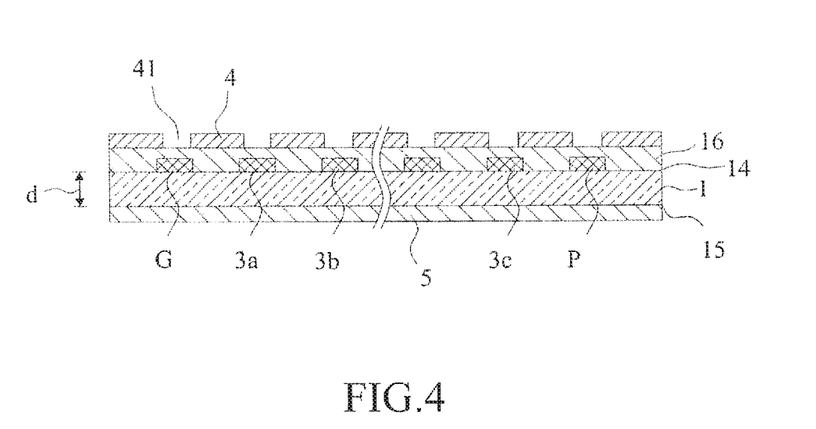
FIG. 4 is a cross-sectional view taken along line 4-4 of FIG. 2.
Figure 5:
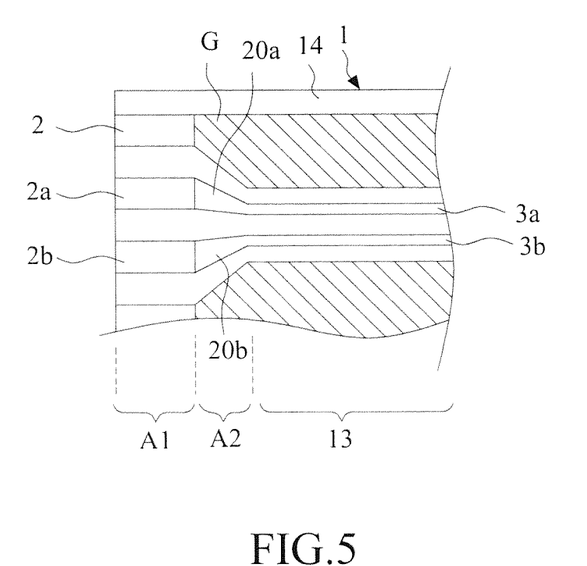
FIG. 5 a top plan view of FIG. 2.

Referring collectively to FIGS. 3 and 4, the substrate 1 has a predetermined substrate thickness d. One surface of the substrate 1 is provided as the component surface 14, while an opposite surface serves as a grounding surface 15. In an actual product, the component surface 14 of the substrate 1 comprises an insulation layer 16 formed thereon, a shielding layer 4 formed on the insulation layer 16, and an impedance control structure 41 formed in the shielding layer 4.

Figure 6:
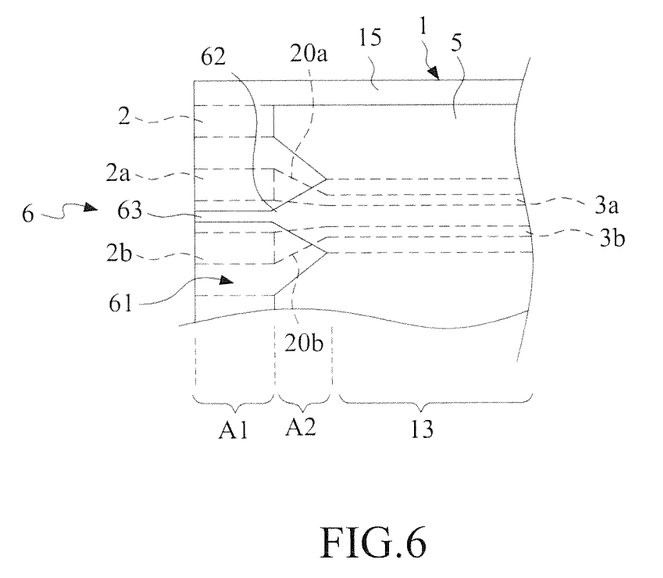
FIG. 6 is a bottom view of FIG. 2, showing spatial relationship among an attenuation reduction grounding pattern structure according to the first embodiment of the present invention and a high frequency connection pad, a transition region, and differential mode signal lines.

Referring simultaneously to FIGS. 3 and 6, the grounding surface 15 of the substrate 1 comprises a continuous grounding layer 5 formed thereon at a location corresponding to the differential mode signal lines 3a, 3b. The grounding layer 5 and the differential mode signal lines 3a, 3b form capacitive coupling and establish an electric field. The differential mode signal lines 3a, 3b that are laid on the extension section 13 of the substrate 1 have a width that is smaller than a width of the high frequency connection pads 2a, 2b, so that a transition zone A2 is defined between the connection of the differential mode signal lines 3a, 3b and the high frequency connection pads 2a, 2b. The present invention comprises an attenuation reduction grounding pattern structure 6 formed in the grounding layer 5 at a location corresponding to the transition zone A2. In the instant embodiment, the attenuation reduction grounding pattern structure 6 is made up of a hollowed area 61 and at least one protruded portion 62. The protruded portion 62 is connected to the grounding layer 5 and the protruded portion 62 protrudes by a predetermined length L in a protrusion direction J2 from the grounding layer 5 toward the high frequency connection pads 2a, 2b and extending along the adjacent high frequency connection pads 2a, 2b. The protruded portion 62 and differential mode signal extended sections 20a, 20b within the transition zone A2 form, in the transition zone A2, a polarization-direction-varying electrical field E. The polarization-direction-varying electrical field E has electrical field intensity related to the substrate thickness d and the pattern structure of the protruded portion 62 of the substrate 1. Thus, the polarization-direction-varying electrical field E changes gradually from a vertical electric field (namely the vertical electric field formed between the differential mode signal extended section 20*a*, 20*b* and the protruded portion 62) to a horizontal electric field (namely the horizontal electric field formed between the high frequency connection pads 2*a*, 2*b*) in a direction from the transition zone A2 towards the high frequency connection pads 2*a*, 2*b*.

With the polarization-direction-varying electrical field E induced by the arrangement of the attenuation reduction grounding pattern structure 6, the present invention reduces reflection loss occurring in the transmission of a high frequency signal, achieves an excellent effect of impedance match, reduces the probability of error in the transmission of a high frequency differential mode signal, and ensures the quality of high frequency signal transmission.

Besides extending to the transition zone A2, when necessary, the protrusion length of the protruded portion 62 may further extend along the high frequency connection pads 2*a*, 2*b* to form an extended protruded portion 63, such that the extended protruded portion 63 extends to free ends of the high frequency connection pads 2*a*, 2*b* to further help gradually convert the vertical electric field of the differential mode signal lines into the horizontal electric field required by the high frequency connection pads.

Figure 7:
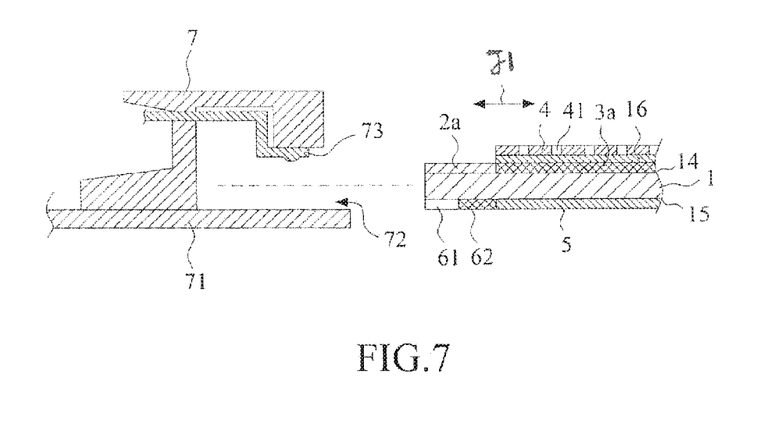
FIG. 7 is schematic view illustrating a flexible circuit board according to the present invention is insertable into, but in a separated condition from, a female socket connector.

Referring to FIG. 7, which is schematic view illustrating an application in which the flexible circuit board 100 according to the first embodiment of the present invention is insertable into a female socket connector 7, the female socket connector 7 is provided on a flexible circuit board 71. When the flexible circuit board 100 of the present invention is inserted into an insertion slot 72 of the female socket connector 7, the high frequency connection pads 2*a*, 2*b* of the flexible circuit board 100 are positioned to respectively engage conductive terminals 73 mounted in the female socket connector 7.

Figure 8:
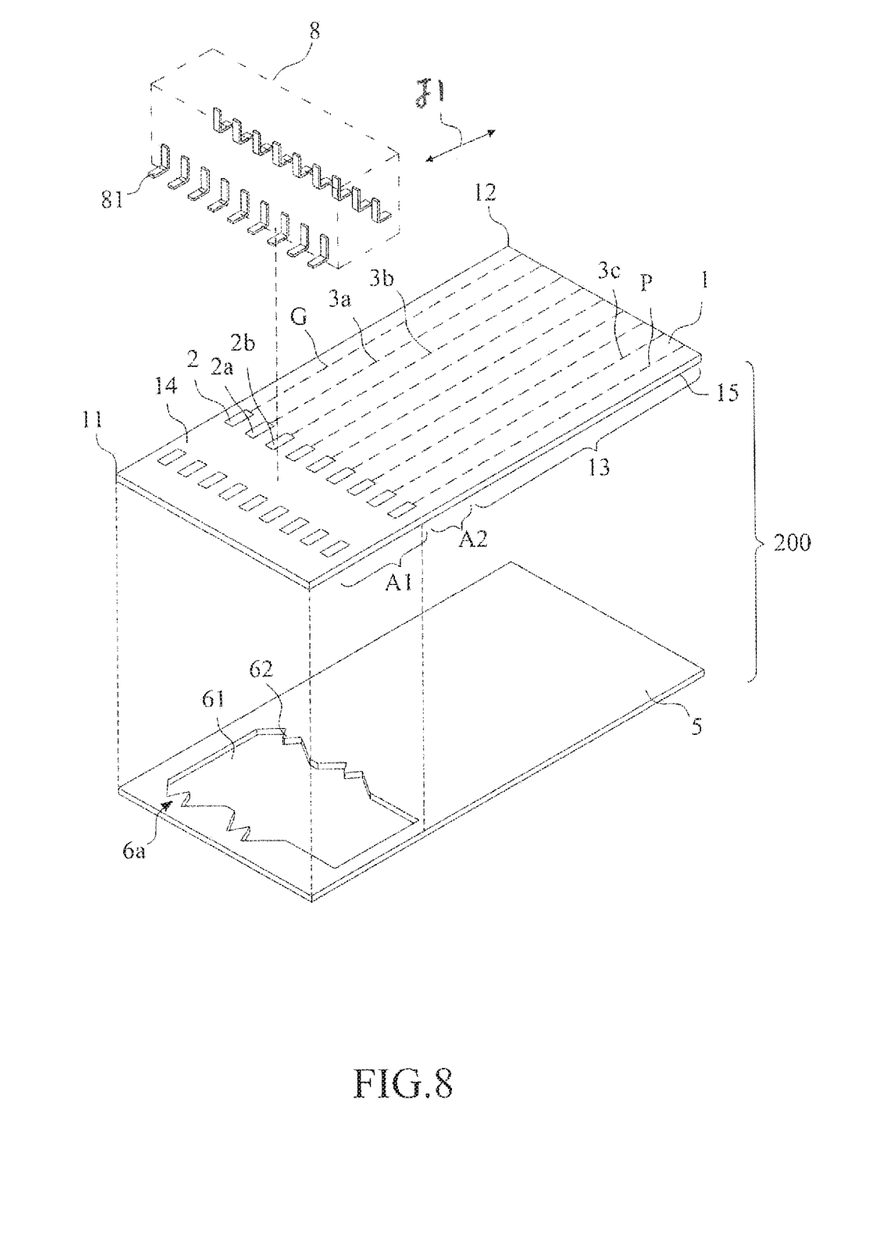
FIG. 8 is an exploded view showing a second embodiment of the present invention.
Figure 9:
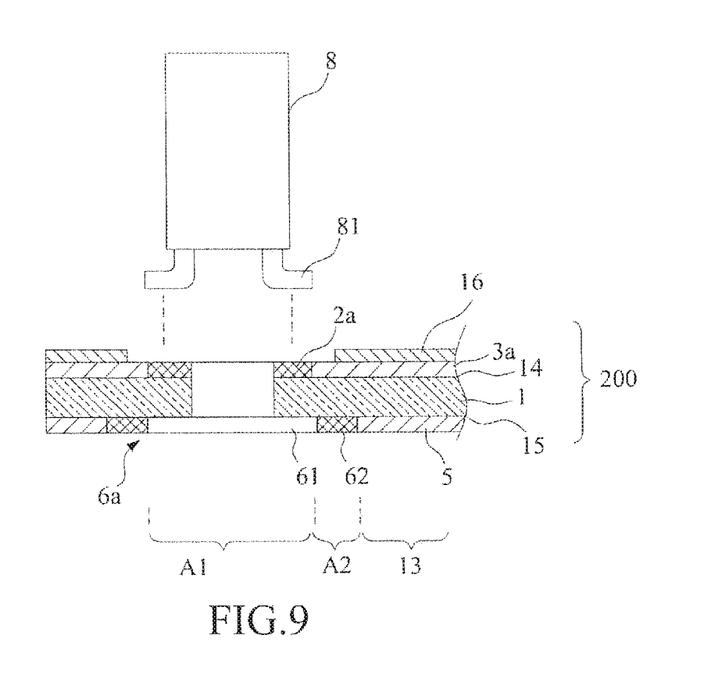
FIG. 9 is a cross-sectional view of the second embodiment of the present invention.

Referring to FIGS. 8 and 9, which are respectively an exploded view and a cross-sectional view of a second embodiment of the present invention, the instant embodiment provides a flexible circuit board 200 having a structure that is substantially similar to that of the first embodiment with a difference therebetween residing in that the first end 11 of the component surface 14 of the substrate 1 is provided with more than two rows of a plurality of connection pads 2 and a known connector 8 or an integrated circuit device is mounted at a location corresponding to the connection pads 2 with signal connection pins 81 of the connector 8 being bonded with known soldering to the connection pads 2. The connection pads 2 comprises at least a pair of high frequency connection pads 2*a*, 2*b*.

In the instant embodiment, the grounding layer 5 comprises an attenuation reduction grounding pattern structure 6*a* that is formed at a location corresponding to the connection pad laying zone A1 and similarly comprises a hollowed area 61 and at least one protruded portion 62. The hollowed area 61 and the protruded portion 62 are of structures that are substantially similar to those of the previous embodiment. The hollowed area 61 is arranged to cover a transition zone A2 formed at the connection between the differential mode signal lines 3*a*, 3*b* of the extension section 13 and the high frequency connection pads 2*a*, 2*b*.

When the connector 8 is soldered and positioned on the connection pads 2, the protruded portion 62 of the attenuation reduction grounding pattern structure 6*a* and the high frequency connection pads 2*a*, 2*b* and the signal connection pins 81 of the connector 8 form, in the transition zone A2, a polarization-direction-varying electrical field E. With the polarization-direction-varying electrical field E induced by the arrangement of the attenuation reduction grounding pattern structure 6, reflection loss occurring in the transmission of a high frequency signal is reduced; an excellent effect of impedance match is achieved; the probability of error in the transmission of a high frequency differential mode signal is reduced; and the quality of high frequency signal transmission can be ensured.

Figure 10:
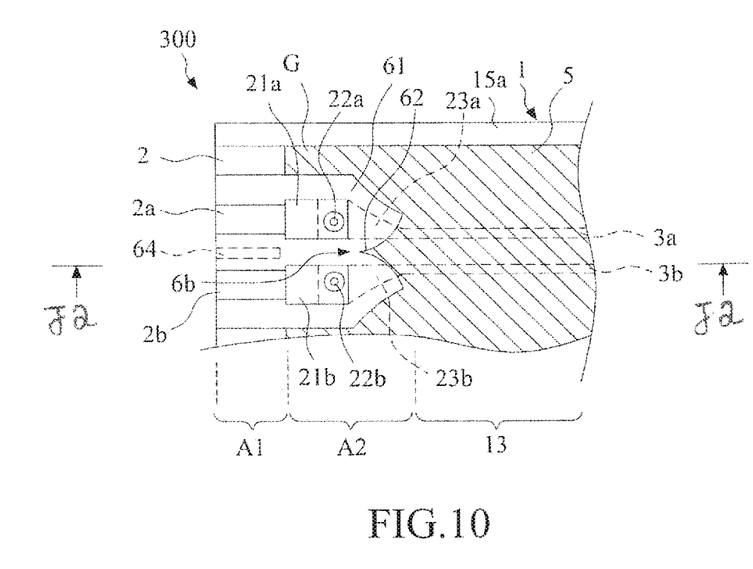
FIG. 10 is a top plan view showing a third embodiment of the present invention.
Figure 11:
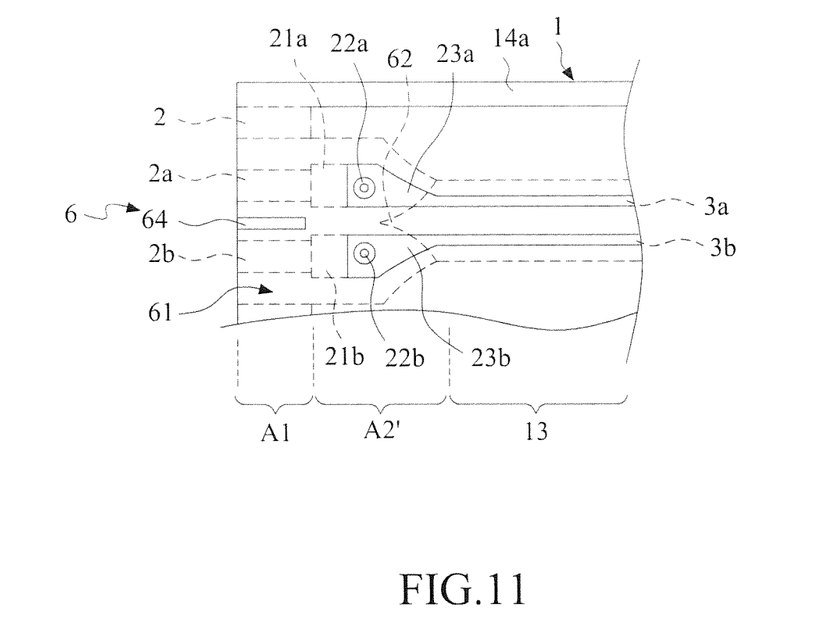
FIG. 11 is a bottom view showing the third embodiment according to the present invention.
Figure 12:
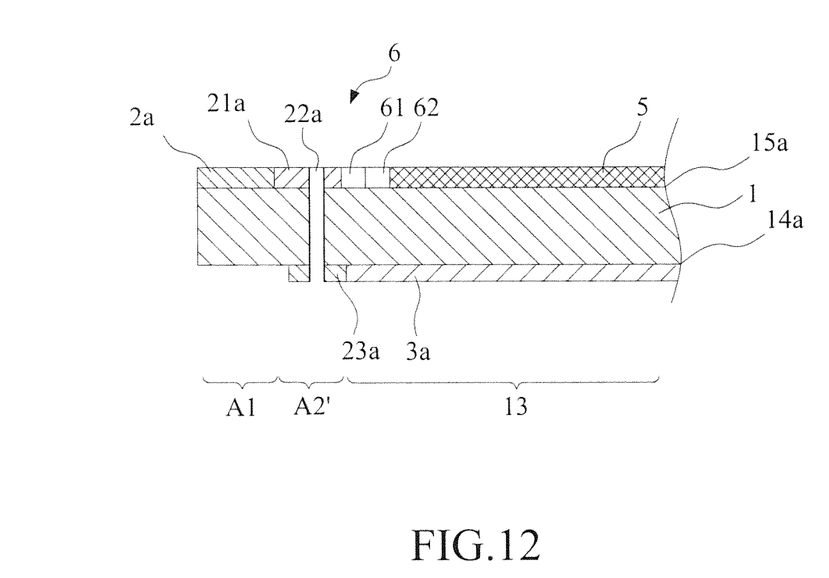
FIG. 12 is a cross-sectional view of the third embodiment of the present invention.

Referring to FIGS. 10-12, which are respectively a top plan view, a bottom view, and a cross-sectional view of a third embodiment according to the present invention, compared to the first embodiment, the third embodiment of the present invention provides a flexible circuit board 300 that is made different in that a lower surface of the substrate 1 is used as a component surface 14*a*, while an upper surface thereof serves as a grounding surface 15*a*. The connection pads 2 and the high frequency connection pads 2*a*, 2*b* are formed on the upper surface of the substrate 1 (namely being coplanar with the grounding surface 15*a*).

The high frequency connection pads 2*a*, 2*b* are each provided with a conductive via arrangement extension section 21*a*, 21*b* and at least one conductive via 22*a*, 22*b* is formed in each conductive via arrangement extension section 21*a*, 21*b* and is connected to the corresponding high frequency connection pad 2*a*, 2*b*, whereby the high frequency connection pads 2*a*, 2*b* are connected through the conductive vias 22*a*, 22*b* to the differential mode signal extended sections 23*a*, 23*b* formed on the component surface 14*a* of the substrate 1 to be further connected to the differential mode signal lines 3*a*. 3*b* of the component surface 14*a* of the substrate 1. With the arrangement of the conductive vias 22*a*, 22*b*, the flexible circuit board 100 may achieve a purpose of double-sided board wire jumping or multi-layered board signal line jumping.

In the third embodiment, a grounding layer 5 is formed on the grounding surface 15*a* of the substrate 1. The grounding layer 5 is connected to the grounding line G. Connection of the differential mode signal lines 3*a*, 3*b* through the conductive vias 22*a*, 22*b* to the high frequency connection pads 2*a*, 2*b* is defined as a transition zone A2'.

The grounding layer 5 comprises a hollowed area 61 and the protruded portion 62 formed in the transition zone A2' corresponding to the connection pad laying zone A1 and the conductive via arrangement extension sections 21*a*, 21*b* to constitute an attenuation reduction grounding pattern structure 6*b*. The attenuation reduction grounding pattern structure 6*b* similarly helps the protruded portion 62 and the high frequency connection pads 2*a*, 2*b* to form a polarization-direction-varying electrical field in the transition zone A2' to reduce reflection loss occurring in the transmission of a high frequency signal, achieve an excellent effect of impedance match, reduce the probability of error in the transmission of a high frequency differential mode signal, and ensure the quality of high frequency signal transmission.

In the instant embodiment, except that the protrusion length of the protruded portion 62 extends to the transition zone A2', if necessary, a narrowed grounding line 62 may be further formed on the component surface 14*a* of the substrate 1 at a location corresponding to a neighboring area of free ends of the high frequency connection pads 2*a*, 2*b* and between the high frequency connection pads 2*a*, 2*b* to further help gradually convert the vertical electric field of the differential mode signal lines into the horizontal electric field required by the high frequency connection pads.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. An attenuation reduction grounding pattern structure for connection pads of a flexible circuit board, the flexible circuit board comprising:

a substrate, which includes a first end, a second end, and an extension section located between the first end and the second end and extending in an extension direction, the substrate having a surface forming a component surface and an opposite surface forming a grounding surface;

at least a pair of high frequency connection pads, which are arranged on a connection pad laying zone defined by the component surface of the substrate to be adjacent to and insulated from each other and being adjacent to the first end of the substrate;

at least a pair of differential mode signal lines, which are arranged on the extension section of the substrate to be adjacent to and insulated from each other and are respectively connected to the adjacent high frequency connection pads, the at least a pair of differential mode signal lines carrying at least one the high frequency differential mode signal, an area of connection between the differential mode signal lines and the high frequency connection pads being defined as a transition zone;

the grounding surface of the substrate forming a grounding layer;

wherein the grounding layer includes an attenuation reduction grounding pattern structure formed at a location corresponding to the transition zone, the attenuation reduction grounding pattern structure including:

a hollowed area, which corresponds to the connection pad laying zone, the hollowed area covering the transition zone; and a protruded portion, which extends a predetermined length in a protrusion direction from the grounding layer toward the high frequency connection pads and along the adjacent high frequency connection pads to reach the transition zone;

wherein the protruded portion includes a gradually reduced width so that the protruded portion has a large width connected to the grounding layer and an increasingly reduced width in the extension direction toward the high frequency connection pads.

2. An attenuation reduction grounding pattern structure for connection pads of a flexible circuit board, the flexible circuit board comprising:

a substrate, which includes a first end, a second end, and an extension section located between the first end and the second end and extending in an extension direction, the substrate having a surface forming a component surface and an opposite surface forming a grounding surface;

at least a pair of high frequency connection pads, which are arranged on a connection pad laying zone defined by the grounding surface of the substrate to be adjacent to and insulated from each other and being adjacent to the first end of the substrate, the high frequency connection pads each forming a conductive via arrangement extension section;

at least one conductive via, which is formed in each of the conductive via arrangement extension sections and is connected to the corresponding one of the high frequency connection pads;

at least a pair of differential mode signal lines, which are arranged on the extension section of the substrate to be adjacent to and insulated from each other and are respectively connected through the conductive vias to the adjacent high frequency connection pads, the at least a pair of differential mode signal lines carrying at least one the high frequency differential mode signal, an area of connection between the differential mode signal lines, the conductive vias, and the high frequency connection pads being defined as a transition zone;

the grounding surface of the substrate forming a grounding layer;

characterized in that the grounding layer includes an attenuation reduction grounding pattern structure formed at a location corresponding to the transition zone, the attenuation reduction grounding pattern structure including:

a hollowed area, which corresponds to the connection pad laying zone, the hollowed area covering the transition zone; and a protruded portion, which extends a predetermined length in a protrusion direction from the grounding layer toward the high frequency connection pads and along the adjacent high frequency connection pads to reach the transition zone;

wherein the protruded portion includes a gradually reduced width so that the protruded portion has a large width connected to the grounding layer and an increasingly reduced width in the extension direction toward the high frequency connection pads.

3. The attenuation reduction grounding pattern structure for the connection pads of the flexible circuit board as claimed in claim 1, wherein the protrusion length of the protruded portion, besides extending to the transition zone, further extending in between and along the high frequency connection pads to form an extended protruded portion, the extended protruded portion extending to free ends of the high frequency connection pads.

4. The attenuation reduction grounding pattern structure for the connection pads of the flexible circuit board as claimed in claim 1, wherein the connection pad laying zone comprises a connector mounted thereto, the connector comprising a plurality of high frequency signal connection pins, the high frequency signal connection pins being respectively soldered to and positioned on the high frequency connection pads.

5. The attenuation reduction grounding pattern structure for the connection pads of the flexible circuit board as claimed in claim 2, wherein the component surface of the substrate comprises a narrow grounding line formed at a location corresponding to a neighboring area of the high frequency connection pads and between the adjacent high frequency connection pads.

* * * * *